United States Patent
Speier et al.

(10) Patent No.: US 11,105,871 B2
(45) Date of Patent: Aug. 31, 2021

(54) METHOD AND DEVICE FOR CONTROLLING A MAGNETIC RESONANCE IMAGING SYSTEM

(71) Applicant: Siemens Healthcare GmbH, Erlangen (DE)

(72) Inventors: Peter Speier, Erlangen (DE); Daniel Staeb, Port Melbourne (AU)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/815,195

(22) Filed: Mar. 11, 2020

(65) Prior Publication Data
US 2020/0292648 A1 Sep. 17, 2020

(30) Foreign Application Priority Data
Mar. 11, 2019 (EP) .................................... 19161789

(51) Int. Cl.
*G01R 33/36* (2006.01)
*G01R 33/3415* (2006.01)
*G01R 33/483* (2006.01)

(52) U.S. Cl.
CPC ..... *G01R 33/3678* (2013.01); *G01R 33/3415* (2013.01); *G01R 33/4835* (2013.01)

(58) Field of Classification Search
CPC ............ G01R 33/3678; G01R 33/3415; G01R 33/4835
See application file for complete search history.

(56) References Cited

U.S. PATENT DOCUMENTS

| 5,903,149 | A | 5/1999 | Gonen et al. | |
|---|---|---|---|---|
| 2017/0160365 | A1* | 6/2017 | Helle | A61B 5/0044 |
| 2018/0292486 | A1* | 10/2018 | Gulani | G01R 33/246 |
| 2018/0306880 | A1* | 10/2018 | Salerno | A61B 5/055 |

OTHER PUBLICATIONS

Breuer, Felix A. et al. "Controlled Aliasing in Parallel Imaging Results in Higher Acceleration (CAIPIRINHA) for Multi-Slice Imaging" Magnetic Resonance in Medicine; vol. 53; pp. 684-691; 2005.
Geethanath et al: "Compressed sensing MRI: a review.", Critical reviews in biomedical engineering 2013; 41 (3): 183-204; DOI: 10.1615/CritRevBiomedEng.2014008058; 2013.
Bieri, O. et al. "Analysis and Compensation of Eddy Currents in Balanced SSFP" Magnetic Resonance in Medicine, vol. 54, pp. 129-137, 2005 // DOI 10.1002/mrm.20527.

(Continued)

*Primary Examiner* — Gregory H Curran
(74) *Attorney, Agent, or Firm* — Schiff Hardin LLP

(57) ABSTRACT

Techniques are described for controlling a magnetic resonance imaging system to facilitate an improvement in Simultaneous Multislice Imaging, especially concerning a compensation of eddy currents. This is achieved by simultaneously measuring at least two slices by the magnetic resonance imaging system while applying a pulse sequence. In the course of the pulse sequence for measuring k-space lines, a set of in-plane encoding signals (that are typically gradients) are applied with a set of Hadamard encoding signals in an interleaved scheme.

14 Claims, 5 Drawing Sheets

(56) References Cited

OTHER PUBLICATIONS

Mueller, S.: "Simultaneous Multislice Imaging (SIMUSIM) for Improved Cardiac Imaging"; in: Magnetic Resonance in Medicine; vol. 10; pp. 145-155; 1989; ISSN 0740-3194/89.

Barth, Markus et al. "Simultaneous Multislice (SMS) Imaging Techniques", Magnetic Resonance in Medicine, vol. 75, pp. 63-81, 2016 // DOI: 10.1002/mrm.25897.

Pruessmann, Klaas P. et al. "Advances in Sensitivity Encoding With Arbitrary k-Space Trajectories" Magnetic Resonance in Medicine, vol. 46, No. 4, pp. 638-651, 2001; 2001.

Staeb, Daniel et al. "CAIPIRINHA Accelerated SSFP Imaging" Magnetic Resonance in Medicine, vol. 65, pp. 157-164, 2011 // DOI:10.1002/mrm.22600.

Souza, S. P. et al. "SIMA: Simultaneous Multislice Acquisition of MR Images by Hadamard-Encoded Excitation" Journal of Computer Assisted Tomography, vol. 12, No. 6, pp. 1026-1030, 1988; 1988.

Yang A. et al.: "Simultaneous Multislice MRF with Hadamard RF-Encoding"; International Society for Magnetic Resonance in Medicine, 25th Annual Meeting & Exhibition, No. 3838, Apr. 7, 2017 (Apr. 7, 2017); XP040691406; Honolulu, HI, USA; 2017.

Setsompop, Kawin, et al. "Blipped-controlled aliasing in parallel imaging for simultaneous multislice echo planar imaging with reduced g-factor penalty." Magnetic resonance in medicine 67.5 (2012): 1210-1224.; 2012.

Kim J.-M.: "Hadamard and Sensitivity Encoding (H-SENSE) for Simultaneous Multi-Slice MR Imaging"; Proceedings of the International Society for Magnetic Resonance in Medicine, 23rd Annual Meeting and Exhibition; No. 2407, May 15, 2015 (May 15, 2015), pp. 2407, XP040668084; Toronto, Canada; 2015.

European Office Action dated Sep. 20, 2019 for Application No. 19 1617 89.3.

\* cited by examiner

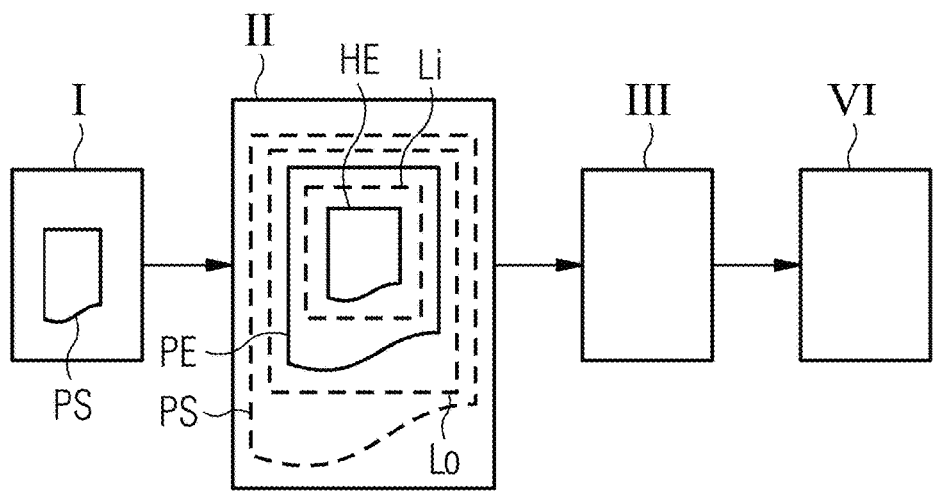
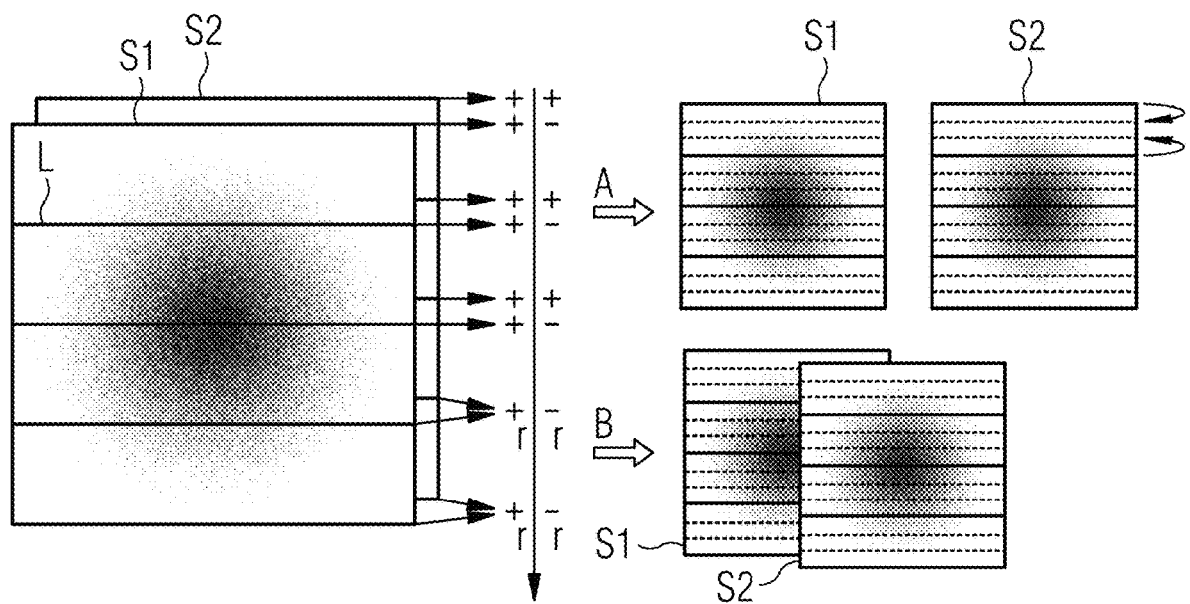

METHOD AND DEVICE FOR CONTROLLING A MAGNETIC RESONANCE IMAGING SYSTEM

CROSS-REFERENCE TO RELATED APPLICATIONS

The present application claims the benefit of the filing date of European patent application no. 19161789.3, filed on Mar. 11, 2019, the contents of which are incorporated herein by reference in their entirety.

TECHNICAL FIELD

The present disclosure relates to a method and a device for controlling a magnetic resonance imaging system ("MRI system"), a control unit for a magnetic resonance imaging system, and a magnetic resonance imaging system.

BACKGROUND

Simultaneous Multislice Imaging ("SMS") is a magnetic resonance imaging technique that includes an acquisition of multiple parallel 2D slices in parallel. SMS is not an acceleration method per se, but a method to gain the signal-to-noise ratio ("SNR") for a constant scan time or invest SNR to increase the number of slices measured in a given time (see e.g. Barth M. et al. "Simultaneous multislice (SMS) imaging techniques"; Magn Reson Med. 2016 January; 75(1):63-81).

A common encoding scheme often used in SMS is the "POMP" encoding scheme (Phase-Offset MultiPlanar), where the relative signal phase between the slices is toggled between 0° and 180° from one phase encoding step to the next. The result is that the signal content of one slice shifted by FOV/2 (the half of the Field Of View). POMP data is fully sampled if the field of view ("FOV") is extended in the direction of the phase encoding ("PE") to accommodate both slices.

Since multislice imaging affords a relatively long measuring time, an acceleration of the measurement is advantageous. The only viable parallel imaging acceleration method in use today for multi-slice imaging, called CAIPIR-INHA, uses the POMP encoding scheme to shift undersampled images of the two slices against each other. The simultaneously acquired and encoded slices are separated in the image reconstruction process. Typically, parallel imaging reconstruction methods such as GRAPPA or SENSE are implemented. However, the relative shift of the slices in the FOV drastically reduces the SNR penalty (i.e. decreases the "g-factor" noise amplification) for the parallel imaging reconstruction (see. e.g. Breuer et al. "Controlled aliasing in parallel imaging results in higher acceleration (CAIPIR-INHA) for multi-slice imaging"; Magn Reson Med 2005; 53:684-691).

The phase modulation of k-space that is required to shift the different slices with respect to each other can be introduced by modulating the RF phase (Magn Reson Med 2005; 53:684-691, Magn Reson Med. 2011 January; 65(1):157-64) for each slice individually or by switching additional gradients along the slice encoding axis during the course of the data acquisition (blipped CAIPIRINHA encoding, Setsompop et al.).

Compared to a sequential and conventionally with in-plane parallel imaging accelerated measurement of N slices, a CAIPIRINHA measurement of the same slices provides an SNR advantage. In an ideal case in which no g-factor noise amplification is introduced during the reconstruction, the SNR advantage is equal to $\sqrt{N}$.

Earlier and non-accelerated implementations of SMS, such as SIMA (SIMA: "Simultaneous Multislice Acquisition", see e.g. J Comput. Assist. Tomogr. 1988 November-December; 12(6):1026-30.) or SIMUSIM (SIMUSIM: "Simultaneous Multislice imaging", see e.g. Magn Reson Med. 1989 April; 10(1):145-55) utilized a binary encoding scheme based on a matrix instead of the POMP type acquisition to allow for the separation of the simultaneously excited and encoded slices during the reconstruction process.

This binary encoding is realized by toggling the relative phases of the signal contributions from the different slices over the course of an at least N-times repeated SMS acquisition, whereby N typically equals the number of simultaneously excited slices. This phase modulation is chosen such that the addition or subtraction according to a matrix of the different repetitions results in a constructive interference of the signal of one of the slices and in a destructive interference of the signal of the other slices.

Regarding SIMUSIM, a reconstruction and separation of measured slices occurs in two steps. In a first step, a reconstruction of the measured data is performed. For each measurement (encoding of a slice), there is one reconstructed image in which all slices are superimposed. In a second step, a linear combination of the reconstructed images of the individual measurements is performed in a binary manner and, thus, the slices are reconstructed.

SUMMARY

Imaging sequences such as balanced Steady-State Free Precession sequence (bSSFP-sequence) can be sensitive to eddy currents. This is particularly the case for highly undersampled, centric, irregular (e.g. random, pseudo-random), or non-Cartesian spatial encoding strategies. To minimize such eddy-current effects, the concept of pairing has recently been proposed (Bieri et al., doi:10.1002/mrm.20527). Pairing includes individual spatial encoding steps (e.g. individual phase encoding steps) being repeated in a way that the eddy-current contribution of the initially executed encoding step and the following "paired" encoding step destructively interfere with each other, leading to an overall minimization of eddy currents.

It is the object of the present disclosure to improve upon current techniques to facilitate an improvement in Simultaneous Multislice Imaging, especially concerning a compensation of eddy currents. This object is achieved by the various techniques as discussed herein and further with respect to the independent claims.

For example, a method according to the disclosure for controlling a magnetic resonance imaging system comprises the following steps.

First, a pulse sequence is applied that is designed for simultaneous excitation of at least two slices with multiband RF signals (radio frequency signals) via the magnetic resonance imaging system. Thus, at least two slices are measured simultaneously by the magnetic resonance imaging system when applying the pulse sequence. The general arrangement of signals, typically RF-pulses and gradients, depends on the chosen examination. However, some of the signals of the pulse sequence may be arranged in a specific manner that is further explained in the various embodiments presented herein. For instance, a known pulse sequence (e.g.

a pulse sequences typically applied in Simultaneous Multi-slice Imaging) may be modified by the following feature as further described below.

Second, in the course of the pulse sequence for measuring k-space lines, a set of in-plane encoding signals (that are typically gradients) are applied together with a set of Hadamard encoding signals in an interleaved scheme. The in-plane encoding signals are signals for spatial encoding within a slice, i.e. perpendicular to the normal vector of the slice (parallel to the slice) and are for instance phase encoding signals (gradients), at least in the Cartesian case.

The two steps described above may be performed by modifying a predetermined pulse sequence by adding and/or re-arranging one or more of gradients and/or RF-pulses, or by creating a specially-manufactured pulse sequence, which may then be applied. However, the two steps generally do not require one single pulse sequence, since the signals of the second step above could be added while applying the pulse sequence from step 1.

In an embodiment, the method may additionally include the following steps:

First, providing a pulse sequence designed for simultaneous excitation of at least two slices with multi-band RF signals;

Second, modifying this pulse sequence by arranging in the course of the pulse sequence for measuring k-space lines a set of in-plane encoding signals and a set of Hadamard encoding signals in an interleaved scheme under the special features explained above; and Third, applying the modified pulse sequence to the MRI-system.

Thus, both of the two steps explained in the course of the method according to the present disclosure (the application of the pulse sequence and the application of the specially arranged signals to the MRI-system) are achieved with this modified pulse sequence.

A Hadamard encoding is achieved by varying the relative phases of the signal contributions from the different slices. An encoding of the relative phases of a k-space line (e.g. a phase encoding (PE) line) of different slices could be achieved by gradients and/or with RF phase variations. The Hadamard encoding adds special information to the measured data that is needed to separate the contributions from the simultaneously acquired slices while reconstructing images from the thus recorded data. Concerning the term "Hadamard encoding", there are two schemes that may be used as examples.

The first preferred Hadamard encoding is a "binary" Hadamard encoding, in which the phase of a k-space line is toggled between the two values 0° and 180°. It could be said that the sign of a phase is toggled between '+' and '−'. A second preferred Hadamard encoding is an "extended" Hadamard encoding, in which the phase of a k-space line is shifted in more than two steps, e.g. between the discrete values 0°, 90°, 180°, 270° (four slices); however, other values and other numbers of slices may also be chosen. The values for the phase-shift may be chosen such that phase-induced values could be annihilated by adding or subtracting the recorded data. As said above, the extended Hadamard encoding is especially applied together with an undersampled in-plane encoding, but it could also be applied in the special execution loop explained in further detail herein.

The principle of undersampling is well known in the technical field of magnetic resonance tomography. With undersampling, there is measured a number of k-space lines that is significantly lower than the number of lines that has to be measured to achieve a given image resolution and cover a field of view (FoV) without aliasing after a normal reconstruction. To obtain images with a suitable resolution and a given FoV with an undersampled dataset, there exist special reconstruction methods. Some example methods are described in the following. The undersampling could be achieved, for instance, by using the same undersampling scheme used in parallel imaging or compressed sensing applications.

The application in an interleaved scheme means that the set of in-plane encoding signals and the set of Hadamard encoding signals are applied in the form of an execution loop having an inner loop in which one set of signals (e.g. the set of in-plane encoding signals) is applied, and an outer loop in which the other set of signals (e.g. the set of Hadamard encoding signals) is applied.

According to the present disclosure, a set of extended Hadamard-encoding signals is applied together with an undersampled set of in-plane encoding signals (especially an undersampled set of phase encoding signals) and/or wherein the set of in-plane encoding signals is applied in the outer loop and the set of Hadamard encoding signals is applied in the inner loop in the execution loop. An execution loop in which the set of in-plane encoding signals is applied in the outer loop, and the set of Hadamard encoding signals is applied in the inner loop, is a loop in which the signals for several Hadamard encoding steps (e.g. gradients and/or RF-pulses) are applied in a continuous arrangement, and the in-plane encoding signals are arranged between these continuous arrangements, with each performing one in-plane encoding between the continuous arrangements of Hadamard encodings.

Regarding the example of a binary Hadamard encoding, a k-space line in both slices is chosen (in-plane encoding), and then the phase of this k-space line is measured '+$_r$,' then toggled to '−$_r$,' and measured again (two binary Hadamard encodings), and then the next k-space line is chosen (next in-plane encoding), and again two binary Hadamard encodings are applied, and so on. The designation '+$_r$' here means the signals from the two slices have the same phase ('++' or '−−') and '−$_r$,' means that they have opposite phase ('+−' or '−+'). Typically, the expressions '+' and '−' are commonly used in this technical field, however, here the index 'r' has been added to make clear that the "relative" phase difference is meant and not an absolute phase (like 0° or 180°).

This arrangement provides the benefit of a reduced motion sensitivity and (as a very important benefit) a very good eddy current compensation. This appears especially relevant in the case of bSSFP sequences, in which the same in-plane encoding is applied at least once.

To summarize, important aspects of the present disclosure are the acceleration of the measurement by omitting a part (or all) of the phase encodings of a subset of the k-space lines to shorten the time of measurement, or changing the order of the loops of the in-plane encoding and the Hadamard encoding. This is advantageous to reduce eddy currents.

A such measured dataset may then be reconstructed with a SIMA or SIMUSIM reconstruction method, in which this reconstruction method tolerates undersampling.

As an example, a device according to the disclosure for controlling a magnetic resonance imaging system may comprise the following components:

an output unit designed for providing a pulse sequence designed for simultaneous excitation of at least two slices with multi-band RF to a magnetic resonance imaging system;

a sequence-designing unit designed for applying, in the course of the pulse sequence for measuring k-space lines, a set of in-plane encoding signals and a set of Hadamard encoding signals in an interleaved scheme in form of an execution loop having an inner loop in which one set of signals is applied, and an outer loop in which the other set of signals is applied, wherein a set of extended Hadamard-encoding signals is applied together with an undersampled set of in-plane encoding signals and/or the set of in-plane encoding signals is applied in the outer loop and the set of Hadamard encoding signals is applied in the inner loop of the execution loop.

As an example, a control unit for controlling a magnetic resonance imaging system according to the disclosure comprises a device according to the disclosure.

As another example, a magnetic resonance imaging system according to the disclosure comprises a control unit according to the disclosure.

Some units or modules of the device or the control unit mentioned above can be completely or partially realized as software modules running on a processor of a device or a control unit (e.g. a control computer). A realization largely in the form of software modules can have the advantage that applications already installed on an existing system can be updated with relatively little effort to install and run these units of the present disclosure. The object of the disclosure is also achieved by a computer program product (e.g. a non-transitory computer-readable medium) with a computer program that is loadable into the memory of a device or a control unit of an MRI system, and which comprises program units to perform the steps of the method embodiments as discussed herein when the program is executed by the control unit or the device. In addition to the computer program, such a computer program product can also comprise additional or alternative components such as documentation, hardware components such as a hardware key (e.g. a dongle), etc. to facilitate access to the software.

A computer readable medium such as a memory stick, a hard-disk, or other transportable or permanently-installed carrier can serve to transport and/or to store the executable parts of the computer program product so that these can be read from a processor unit of a control unit or a device. A processor unit can comprise one or more microprocessors or their equivalents.

Advantageous embodiments and features of the disclosure are further provided by the dependent claims, as well as the following description. Features of different claim categories may be combined as appropriate to give further embodiments not otherwise described herein.

According to an embodiment, the undersampled set of in-plane encoding signals, e.g. in form of a set of phase encoding signals, is applied by leaving out complete pairs of k-space lines (especially phase encoding-line ("PE-line") pairs), e.g. based on a regular grid, or on an irregular pattern (e.g. for compressed sensing type recons). An irregular pattern means that the measured k-space lines are not equidistant.

In general, Cartesian or non-Cartesian acquisitions can be applied. The fully sampled measurement would take as long as the serial acquisition of the two slices. Any parallel imaging acceleration is relative to this time.

Cartesian imaging acquires k-space lines with the following restrictions:
1. lines are straight,
2. lines are parallel,
3. lines fall on a Cartesian (regular and orthogonal) grid
4. lines have the same length
5. lines start at the same coordinate in line direction.

Non-Cartesian imaging acquires k-space in lines as well, but violates some or all of the above restrictions. Some examples are spiral imaging, in which each line is a spiral starting from the same point at the center of k-space (violates restrictions 1-3), as well as radial imaging, in which straight lines are oriented radially like the spokes in a wheel (violates restriction 2 and 3).

The embodiments discussed herein may be applied to these generalized acquisitions because it is generally only important that a set of lines encodes the spatial information within a slice (in-plane encoding), and that lines can be identified by a number (line index). According to an embodiment, a set of extended Hadamard encoding signals is applied, designed to use an integer number N of different phases, wherein the integer number N is a divisor of 360° and the single phases in the used set of phases are 360°/N spaced apart in phase space. As an example, the set of phases comprises the phases 0°, 90°, 180° and 270°, and four slices are measured.

According to an embodiment, the execution loop is designed such that a number of k-space lines, e.g. each k-space line (PE line), is measured a number of times with two or more phases of the Hadamard encoding, e.g. each time with a different phase or at least such that different individual arrangements of phases are applied to the lines of the different slices. This is achieved by measuring a k-space line with a first phase (e.g. 0°) and afterwards measuring this k-space line with another phase (e.g. 180°) and so on, wherein all the phases are phases of the Hadamard encoding. When four slices are measured, these phases could be e.g. 0°, 90°, 180° and 270°.

In an embodiment, a set of binary Hadamard encoding signals are applied, wherein a number of k-space lines (e.g. PE-lines), e.g. each k-space line, is measured (at least once) with both Hadamard encodings (i.e. the lines are measured with both phase cycles '+$_r$' (e.g. with a relative phase of 0°) and '−$_r$' (e.g. with a relative phase of 180°)).

In the course of reconstruction, the two lines measured with two phases (different '−+'/'+−' or same '++'/'−−') could be subtracted or added. With a suitable encoding, while using subtraction, one of the slices could be reconstructed and, by using addition, the other slice could be reconstructed. Alternatively, four slices may be measured, and a set of extended Hadamard encoding signals applied, wherein a number of k-space lines, e.g. each k-space line, is measured with four Hadamard encodings (e.g. 0°, 90°, 180° and 270°). These exemplary degrees refer to the increment of the phase of the Hadamard encoding in the respective slice.

Regarding a measurement with the index j of a slice with the index k, the complex number i and the angle of the Hadamard encoding φ, a reconstruction of this slice k could be achieved by a weighted adding up of four measurements (with different Hadamard encodings) with the summation coefficients as shown in Equation 1 below:

$$e^{\frac{-i \cdot j \cdot k \cdot \varphi}{180 \cdot \pi}} \qquad \text{Eqn. 1}$$

The purpose of these summation coefficients is to "rotate" the complex values of the signals onto the real axis of the complex number space.

In accordance with an embodiment for reconstructing the recorded data, an additional step may include:
Reconstructing separate signals from the measured slices for each k-space line by creating a linear combination over pairs of the k-space lines, wherein a Hadamard combination line by line is applied. This linear combination may be performed by calculating the sum and/or the difference of the pairs of the k-space lines (e.g. when measuring two slices), or a weighted sum with complex factors over a number of the recorded k-space lines (L) (e.g. when measuring more than two slices). These complex factors may be a rotation in the complex plane, with a magnitude of 1.

In accordance with an embodiment for reconstructing the recorded data, especially applied after the reconstructing method described above, an additional step may include:

Reconstructing an image slice by slice for the standard field of view using a parallel reconstruction method or a combined reconstruction method. While the first method is a two-step process, this combined reconstruction method achieves a slice separation and generation of missing k-space lines to remove undersampling in one step. This may be particularly useful when used in conjunction with a parallel imaging technique.

According to an embodiment, the measurement is performed by receiving a measured signal with multiple coils that have parallel imaging encoding capability. Thus, the measurement is performed with the MRI signal detected with multiple receiver coils with individual coil sensitivities. It is not necessarily required that those sensitivities are different for the two slices (however, this would be preferred). It is also not necessarily required that encoding capability is available for slice separation (however, this could preferably be applied, also).

According to an embodiment, the same k-space lines in the Hadamard encoded k-space lines (L), e.g. pairs of k-space lines, are omitted in every slice. Thus, an undersampling is achieved that reduces acquisition time.

According to an embodiment, a self-navigation is performed based on Hadamard combined k-space lines (L), e.g. line pairs. These Hadamard encoded lines can be used as slice specific navigators for self-navigation, because slice separation is independent of the in-plane reconstruction.

This self-navigation can be performed based on all lines as well as on a subset of lines. It is preferred to separate the Hadamard encoded contributions of simultaneously measured slices with weighted signal combinations to provide a slice-specific navigation, i.e. based on signals from one slice, only. However, there are other combinations that are able to optimize the signal for navigation, e.g. calculating a weighted sum over the slices. Preferred for navigation is a comparison of the same k-space line from different repeated measurements, e.g. while repeating the measurement for different breath-conditions.

According to an embodiment, a reconstruction system is designed to reconstruct signals and/or images. The reconstruction system is, therefore designed to:

reconstruct separate signals from the measured slices for each k-space line by creating a linear combination, e.g. by calculating the sum and/or the difference, over pairs of the recorded k-space lines, wherein a Hadamard combination line by line is applied, and/or reconstruct an image slice by slice for the standard field of view using a parallel reconstruction method or a combined reconstruction method.

For the reconstruction of separate signals from the measured slices, the reconstruction system may comprise a special Hadamard-reconstruction unit that is designed to reconstruct separate signals from the measured slices for each k-space line by creating a linear combination, e.g. by calculating the sum and/or the difference, over pairs of the recorded k-space lines, wherein a Hadamard combination line by line is applied.

For the reconstruction of an image, the reconstruction system may comprise a special image-reconstruction unit that is designed to reconstruct an image slice by slice for the standard field of view using a parallel reconstruction method or a combined reconstruction method.

Some examples of other reconstruction methods, which may be especially advantageous in the case the k-space is undersampled, include:

a) parallel imaging: starting from a (mostly regular and uniformly subsampled) k-space, complete images are generated using the information from several receiver coils (with sufficiently different sensitivity profiles). This reconstruction can be done either in k-space (e.g. GRAPPA: Generalized Autocalibrating Partially Parallel Acquisitions) or in image space (e.g. SENSE: Sensitivity Encoding). Parallel imaging can also be applied to non-Cartesian k-spaces. Usually, only information from the same slice is used to reconstruct a slice. The method may be particularly useful for a slice-by-slice reconstruction variant.

b) Parallel imaging using information from all slices to reconstruct a single slice. Although this method is a special case (or the 3D equivalent) of above method a), it is nevertheless an advantageous method since it benefits due to a lower g-factor noise gain (g-factor penalty) depending on the slice spacing and coil geometry.

c) Iterative reconstruction techniques (e.g. "iterative SENSE" Nagn Reson Med., 2001 October; 46 (4): 638-511 or "iterative GRAPPA"): These techniques are preferred for non-Cartesian reconstructions. Usually, one begins with a first estimate of the reconstruction, which is then compared with the measurement. From the difference to the measurement, a refined estimate is calculated, and so on. This method may be shortly named "reconstruction in iterative fashion". An iterative reconstruction can be done in k-space or image space, and is advantageous for both the slice-by-slice and the combined reconstruction variant.

d) Model-based or prior-knowledge-based reconstruction techniques (e.g., Compressed Sensing [Crit Rev Biomed Eng 2013; 41 (3): 183-204.]: These are methods that are usually applied iteratively, and involve some form of knowledge a priori in image reconstruction. This can be, for instance, the assumption of a particular dynamic waveform over time in image space or k-space, or information about the expected nature of the image. These methods are advantageous for both the slice-by-slice and the combined reconstruction variants.

All of these reconstruction methods are normally used to reconstruct subsampled measurements, but c) and d) are also suitable for image de-noise.

It is generally preferred to use a k-space line based Hadamard slice separation of each k-space line as a first reconstruction step. After that, in a second reconstruction step, the final reconstruction is performed, e.g. with one of the above explained reconstruction methods. This eliminates the artifacts due to undersampling in every slice.

Together with a change of the loops (Hadamard encoding is done in the inner loop), this reconstruction can be started just during the measurement, which may be particularly advantageous concerning the total time. In addition, a parallel image reconstruction is much easier and better achieved after the initial Hadamard-based separation compared with a reconstruction based on a mix of slices.

The second step of the reconstruction can be extended arbitrarily or replaced by another method (e.g. compressed sensing). In addition, both steps can be achieved with a combined reconstruction method.

One advantage of the embodiments as discussed herein is that there appears to be no g-factor penalty for slice separation. Therefore, there is no SNR loss in situations with bad slice encoding, and there is no calibration scan for slice separation required.

One advantageous effect for a balanced Steady-State Free Precession sequence (bSSFP-sequence), is that two or more slices are recorded, which is a perfect pairing of PE lines for eddy current minimization. This is beneficial for highly undersampled, centric, or irregular acquisition.

CAIPIRINHA for cardiac examinations generally operates in the regime where SNR is lost, since the slices are closely spaced (½ LV length), so parallel imaging encoding capability in slice direction is quite limited.

The embodiments of the present disclosure may also use the Hadamard encoding as an alternative to CAIPIRINHA. While CAIPIRINHA can be described as an accelerated POMP measurement, Hadamard encoding is used in an accelerated SIMA/SIMUSIM measurement. The difference is that, for Hadamard encoding, the same phase encoding lines are measured repeatedly, while for POMP measurements the encodings are not repeated but are incremented with every encoding step.

It should be noted that regarding the Hadamard encoding of the present disclosure, there already exists an encoding technique in the state of the art, where there are measured whole images in different encodings that are later combined with another to separate the contributions of the slices. The method of the state of the art results in a high vulnerability in respect to moving artifacts. However, the embodiments described herein introduce a special aspect with respect to Hadamard encoded k-space lines in an inner loop, i.e. to measure an image once with all necessary encodings.

Other objects and features of the present disclosure will become apparent from the following detailed descriptions considered in conjunction with the accompanying drawings. It is to be understood, however, that the drawings are designed solely for the purposes of illustration and not as a definition of the limits of the disclosure.

BRIEF DESCRIPTION OF THE DRAWINGS/FIGURES

The foregoing and additional features and effects of the application will become apparent from the following detailed description, when read in conjunction with the accompanying drawings in which like reference numerals refer to like elements.

In the diagrams, like numbers refer to like objects throughout. Objects in the diagrams are not necessarily drawn to scale.

FIG. 2 shows a block diagram of an example process flow, in accordance with an embodiment of the present disclosure.

FIG. 3 shows a scheme for an example acquisition and reconstruction of images, in accordance with an embodiment of the present disclosure.

DETAILED DESCRIPTION

Figure 1:
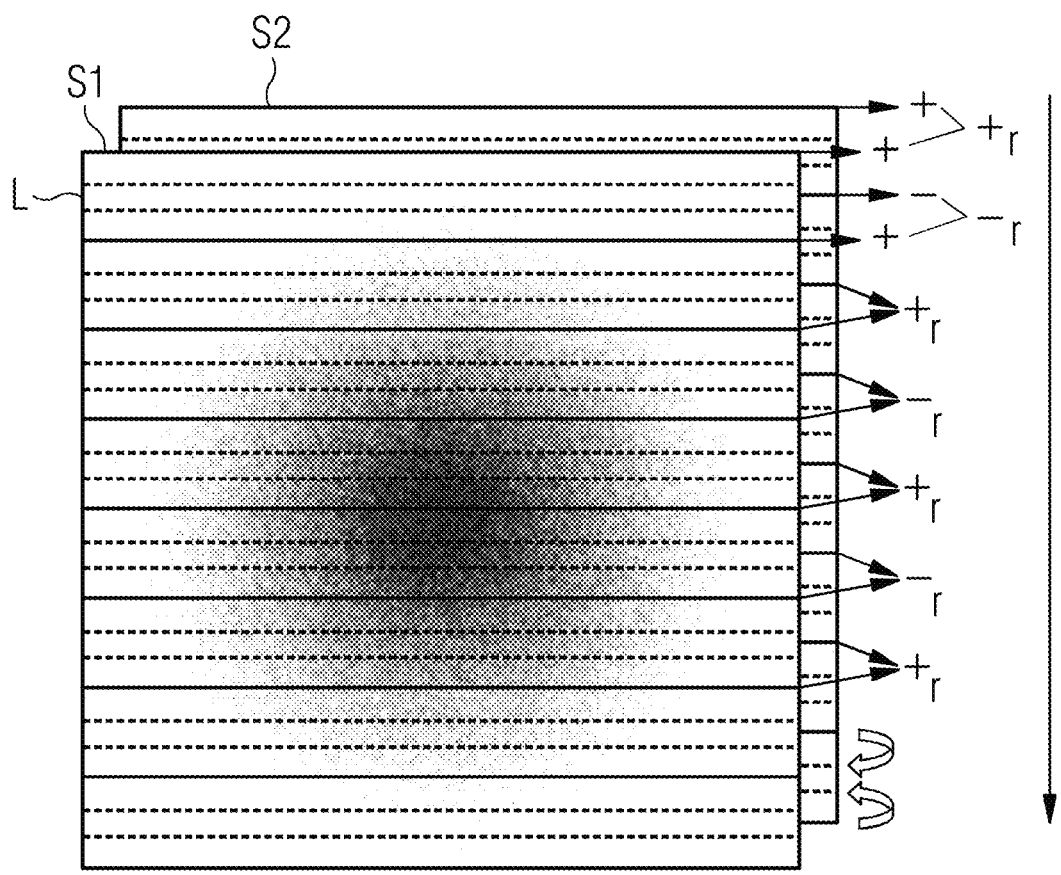
FIG. 1 shows a scheme for an acquisition scheme of the state of the art.

FIG. 1 shows a scheme for an acquisition of the state of the art. In two slices S1, S2, several k-space lines L are measured, while in one slice toggling the phase of any measured k-space line L during in-plane encoding (direction of the right arrow). Concerning the two upper lines, the phases '+' and '−' for the phases of individual lines are shown. The top lines of the two slices are measured with '+' polarization (e.g. 0°) what would be a relative '+$_r$' phase difference. The second top lines of the two slices are measured with '+−' (e.g. 0° and) 180° what would be a relative '−$_r$' phase difference. To enhance clarity, "relative phase differences" (i.e. '+$_r$' for '++' or '−−' and '−$_r$' for '−+' or '+−') are marked by adding an index 'r'. Concerning the following lines, the relative phase difference is given, where '+$_r$' here means '++' and '−$_r$' here means '+−'.

The two bent arrows at the bottom lines outline the reconstruction of further lines (dashed lines) based on adjacent measured k-space lines L.

FIG. 2 shows a block diagram of an example process flow, in accordance with an embodiment of the present disclosure.

In step I, a pulse sequence PS is designed or provided to result in simultaneous excitation of at least two slices with multi-band RF. This pulse sequence may be applied via the magnetic resonance imaging system (while applying additional signals as explained in the further step). Alternatively, this pulse sequence may be modified by adding these additional signals and then applying the modified pulse sequence via the MRI system.

In step II, during the application of the pulse sequence PS for measuring k-space lines, a set of in-plane encoding signals PE and a set of Hadamard encoding signals HE are applied in an interleaved scheme in the form of an execution loop Li, with Lo having an inner loop Li in which one set of signals is applied, and an outer loop Lo in which the other set of signals is applied. A set of extended Hadamard-encoding signals HE is applied together with an undersampled set of in-plane encoding signals PE and/or the set of in-plane encoding signals PE is applied in the outer loop Lo and the set of Hadamard encoding signals HE is applied in the inner loop Li in the execution loop Li, Lo.

As shown by the dashed symbol of the pulse sequence PS around the outer loop Lo in Step II, this may be achieved by modifying the pulse sequence PS (as stated above) by including the execution loop Li, Lo in the pulse sequence PS. However, as also noted above, said signals may also be applied via the MRI system parallel to the application of the pulse sequence.

Alternatively or additionally to the special execution loop Li, Lo, a set of extended Hadamard encoding signals HE can be used, and may be used, for instance, together with an undersampled set of in-plane encoding signals PE.

In step III, a reconstruction of the recorded data is achieved by reconstructing separate signals from the measured slices S1, S2 for each k-space line L by creating a linear combination, e.g. by calculating the sum and/or the difference over pairs of the recorded k-space lines L, wherein a Hadamard combination line-by-line is applied.

In step IV, a reconstruction of an image is achieved by reconstructing an image slice S1 by slice S2 for the standard field of view using a parallel reconstruction method or a combined reconstruction method.

This reconstruction is outlined in FIG. 3.

FIG. 3 shows a scheme for an example acquisition and reconstruction of images, in accordance with an embodiment of the present disclosure. In two slices S1, S2, several k-space lines L are measured, while Hadamard encoding the phase of any measured k-space line L during in-plane encoding (direction of the long arrow). Here, binary Hadamard encoding is used. The upper three lines are shown with the individual polarizations '++' and '+−', wherein '++' would result in a relative polarization of '+$_r$' and '+−' in a relative polarization of '−$_r$' as shown at the two bottom line pairs. Thus, the phase is toggled while measuring each k-space line twice (one with '+$_r$'-phase and one with '−$_r$'-phase).

The two arrows A and B lead to two different reconstruction schemes after measuring two slices S1 and S2 (in a parallel acquisition). Arrow A represents a reconstruction where linear combinations (sum and/or difference) of adjacent pairs of k-space lines L are calculated. The final images are then reconstructed slice-by-slice using an appropriate reconstruction method. Arrow B represents a combined slice separation and image reconstruction.

For instance, using a summarization of the signals of both measurements, the first slice S1 may be reconstructed, and the second slice S2 may be reconstructed by a subtraction.

In various embodiments, the two reconstruction methods are not necessary independently used alternatives, and may be combined with one another.

Figure 4:
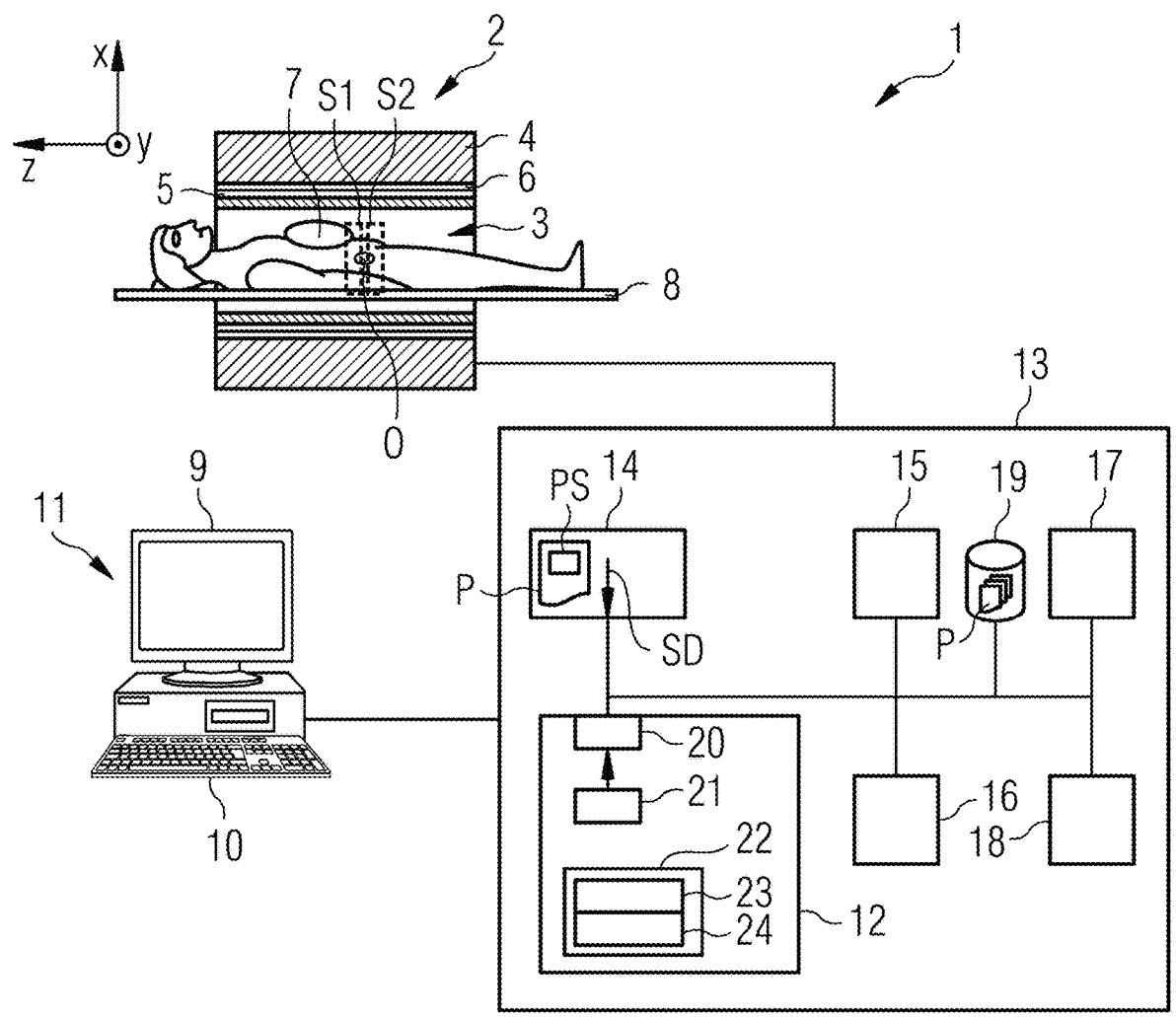
FIG. 4 shows an example MRI system, in accordance with an embodiment of the present disclosure.

FIG. 4 shows an example MRI system, in accordance with an embodiment of the present disclosure. FIG. 4 shows a schematic representation of a magnetic resonance imaging system ("MRI-system") 1. The MRI system 1 includes the actual magnetic resonance scanner (data acquisition unit) 2 with an examination space or patient tunnel 3 in which a patient or test person is positioned on a driven bed 8, in the body of which the actual examination object is located.

The magnetic resonance scanner 2 is typically equipped with a basic field magnet system 4, a gradient system 6, as well as an RF transmission antenna system 5 and an RF reception antenna system 7. In the shown exemplary embodiment, the RF transmission antenna system 5 is a whole-body coil permanently installed in the magnetic resonance scanner 2, in contrast to which the RF reception antenna system 7 is formed as local coils (symbolized here by only a single local coil) to be arranged on the patient or test subject. In principle, however, the whole-body coil can also be used as an RF reception antenna system, and the local coils can respectively be switched into different operating modes.

The basic field magnet system 4 is designed that at least two slices S1, S2 can be recorded. It here is designed in a typical manner so that it generates a basic magnetic field in the longitudinal direction of the patient, i.e. along the longitudinal axis of the magnetic resonance scanner 2 that proceeds in the z-direction. The gradient system 6 typically includes individually-controllable gradient coils to selectively switch (activate) gradients in the x-direction, y-direction, or z-direction independently of one another.

The MRI system 1 as shown is a whole-body system with a patient tunnel into which a patient can be completely introduced. However, in principle the embodiments as described herein may also be used with other MRI systems, for example with a laterally open, C-shaped housing, as well as in smaller magnetic resonance scanners in which only one body part can be positioned.

Furthermore, the MRI system 1 has a central control device 13 that is used to control the MRI system 1. This central control device 13 includes a sequence control unit 14 for measurement sequence control. With this sequence control unit 14, the series of radio-frequency pulses (RF pulses) and gradient pulses can be controlled depending on a selected pulse sequence PS (see FIGS. 5 to 7) or, respectively, a series of multiple pulse sequence PS to acquire magnetic resonance images of the slices S1, S2 within a measurement session. For example, such a series of pulse sequence PS can be predetermined within a measurement or control protocol P. Different control protocols P for different measurements or measurement sessions are typically stored in a memory 19 and can be selected by an operator (and possibly modified as necessary), and then be used to implement the measurement.

To output the individual RF pulses of a pulse sequence PS, the central control device 13 has a radio-frequency transmission device 15 that generates and amplifies the RF pulses, and then feeds them into the RF transmission antenna system 5 via a suitable interface (not shown in detail). To control the gradient coils of the gradient system 6, the control device 13 has a gradient system interface 16. The sequence control unit 14 communicates in any suitable manner with the radio-frequency transmission device 15 and the gradient system interface 16 using any suitable communication protocols and/or techniques (including known techniques) to emit the pulse sequence PS.

Moreover, the control device 13 has a radio-frequency reception device 17 (likewise communicating with the sequence control unit 14 in any suitable manner) to acquire magnetic resonance signals (i.e. raw data) for the individual measurements, which magnetic resonance signals are received in a coordinated manner from the RF reception antenna system 7 within the scope of the pulse sequence PS.

A reconstruction unit 18 receives the acquired raw data and reconstructs magnetic resonance image data therefrom for the measurements. This reconstruction is typically performed on the basis of parameters that may be specified in the respective measurement or control protocol. For example, the image data can then be stored in a memory 19.

Operation of the central control device 13 can take place via a terminal 10, which includes an input unit and a display unit 9 for such a purpose, via which the entire MRI system 1 can thus also be operated by an operator. MR images can also be displayed at the display unit 9, and measurements can be planned and started by means of the input unit (possibly in combination with the display unit 9). Moreover, suitable control protocols may be selected (and possibly modified) with a suitable series of pulse sequence PS as explained above.

In embodiments, the control unit 13 comprises a device 12 designed to perform the method according to the present disclosure. This device 12 may include the following components, which may be implemented as hardware (e.g. computer processors), software, or a combination of both hardware and software (e.g. a non-transitory computer-readable medium with executable instructions stored thereon, as noted above). The device 12 may also include additional less, or alternate components, in various embodiments.

An output unit 20 is configured to provide a pulse sequence PS designed for simultaneous excitation of at least two slices S1, S2 with multi-band RF to the magnetic resonance imaging system 1. The output unit 20 may include one or more processors and/or software, and thus be alternatively referred to herein as control circuitry.

A sequence-designing unit 21 is configured to apply, during the pulse sequence PS for measuring k-space lines, a set of in-plane encoding signals PE and a set of Hadamard encoding signals HE in an interleaved scheme in form of an execution loop Li, Lo. The execution loop Li, Lo has an inner loop Li in which one set of signals is applied, and an outer loop Lo in which the other set of signals is applied, wherein a set of extended Hadamard-encoding signals HE is applied together with an undersampled set of in-plane encoding signals PE and/or wherein the set of in-plane encoding signals (PE) is applied in the outer loop Lo and the set of Hadamard encoding signals HE is applied in the inner loop Li of the execution loop Li, Lo (see e.g. FIG. 2). The sequence-designing unit 21 may include one or more processors and/or software, and thus be alternatively referred to herein as sequence-designing circuitry.

In this example, the device 12 also comprises a reconstruction system 22 that is configured to reconstruct signals and images. The reconstruction system 22 may be implemented, for instance, as a Hadamard-reconstruction unit 23 that is configured to reconstruct separate signals from the measured slices S1, S2 for each k-space line L by creating a linear combination, e.g. by calculating the sum and/or the difference over pairs of the recorded k-space lines, wherein a Hadamard combination line-by-line is applied (see e.g. FIG. 2). For the reconstruction of an image, the reconstruction system 22 may include an image-reconstruction unit 24 that is configured to reconstruct an image slice-by-slice for the standard field of view using, for instance, a parallel reconstruction method or a combined reconstruction method (see e.g. FIG. 2). The reconstruction system 22 may include one or more processors and/or software, and thus be alternatively referred to herein as reconstruction system circuitry.

It should be noted that, in various embodiments, the device 12 may also be implemented by using the sequence control unit 14 that is modified by comprising the output unit 20 (which is typically part of the sequence control unit 14) and the sequence-designing unit 21. Furthermore, the device 12 may also be implemented using the reconstruction unit 18, which may thus be modified to comprise the Hadamard-reconstruction unit 23 and also the image-reconstruction unit 24, as described above.

The MRI system 1 according to the disclosure, and in particular the control device 13, can have a number of additional components that are not shown in detail but are typically present at such systems, For example, the MRI system 1 may include a network interface to connect the entire system with a network and to exchange raw data and/or image data or, respectively, parameter maps, as well as additional data (e.g. patient-relevant data or control protocols).

The manner by which suitable raw data are acquired by radiation of RF pulses, the generation of gradient fields, and MR images are reconstructed from the raw data, may be performed in any suitable manner, such as using known techniques, and thus need not be explained in detail herein.

Figure 5:
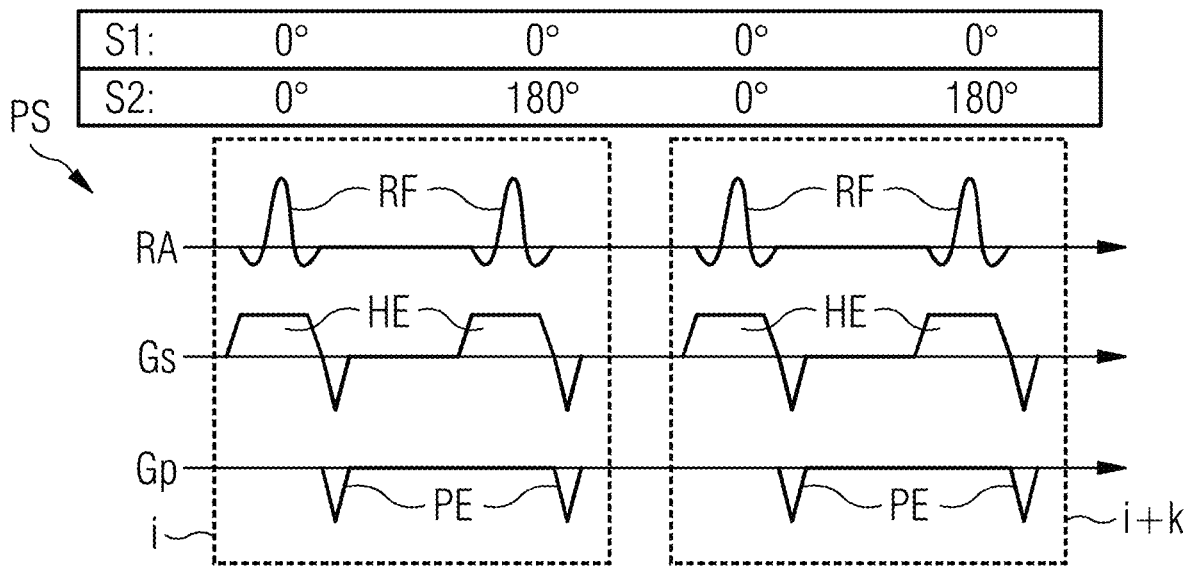
FIG. 5 shows an example a pulse sequence, in accordance with an embodiment of the present disclosure.

FIG. 5 shows an example a pulse sequence, in accordance with an embodiment of the present disclosure. As shown in FIG. 5, a pulse sequence PS is outlined showing three axes. The upper axis is the radio frequency axis RA, in which four radio frequency signals RF are arranged. The second axis is a first gradient axis Gs, in which gradients are applied for slice selection. The third axis is a second gradient axis Gp, in which in-plane encoding signals PE are applied.

Two slices S1, S2 are measured (twice in each cycle i and i+k) with a binary Hadamard encoding scheme, wherein the phase is toggled between 0° and 180° (i.e. '+' and '−') of the second slice S2. Concerning FIG. 4, the term "line" refers to a specific in-plane encoding. Identical in-plane encodings could be Hadamard encoded like complete images.

Figure 6:
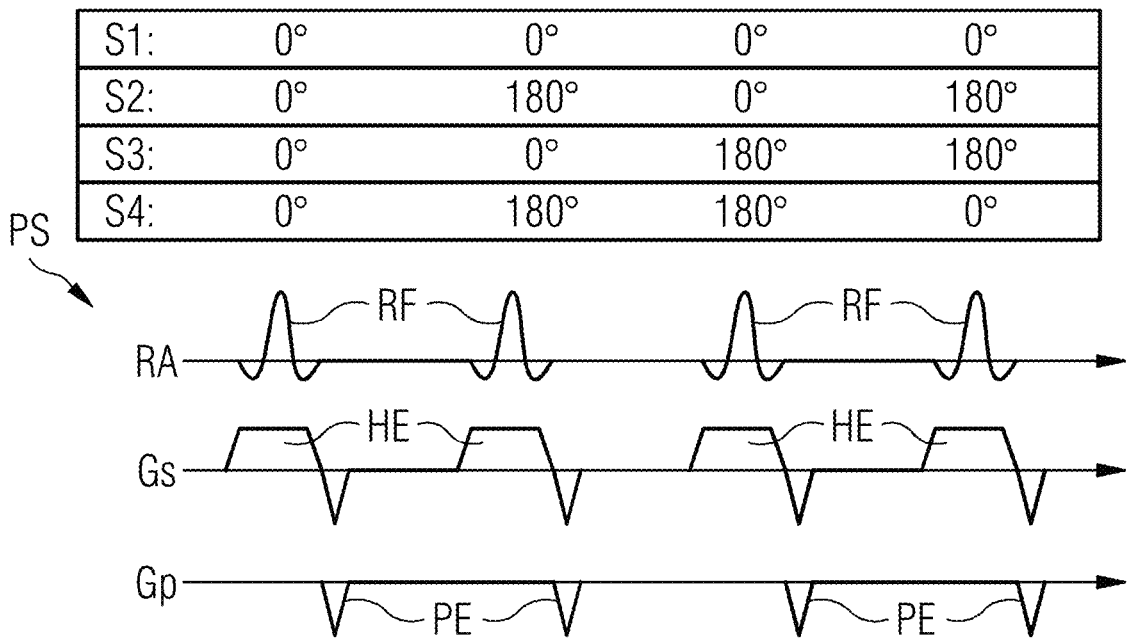
FIG. 6 shows another example of a pulse sequence, in accordance with an embodiment of the present disclosure.

FIG. 6 shows another example of a pulse sequence, in accordance with an embodiment of the present disclosure. In contrast to FIG. 5, the four slices S1, S2, S3, S4 are measured (each four times) with a binary Hadamard encoding scheme, wherein the phase is toggled between 0° and 180° (i.e. '+' and '−') in a Hadamard-matrix scheme. Since there are performed four measurements, all signals shown are part of the first cycle i, and the second cycle i+k (for the next k-space line L) would be subsequent thereto.

The encoding scheme here is generated by the RF-pulses. The frequency components for every slice are applied against each other with the shown phases. In general, a Hadamard encoding could be realized by a variation of the RF-phases or by a variation of the gradients on the slice-selection gradient axis Gs. Here in practice, only RF-encoding is applied, since the phase-cycles could not be generated with gradients applied on the slice-selection gradient axis Gs.

In the case of a more complicated phase-cycle (e.g. extended Hadamard encoding) shown in the following Figure, both variations are possible. Concerning a RF-encoding, the distance of the slices S1, S2 could be chosen arbitrarily.

Figure 7:
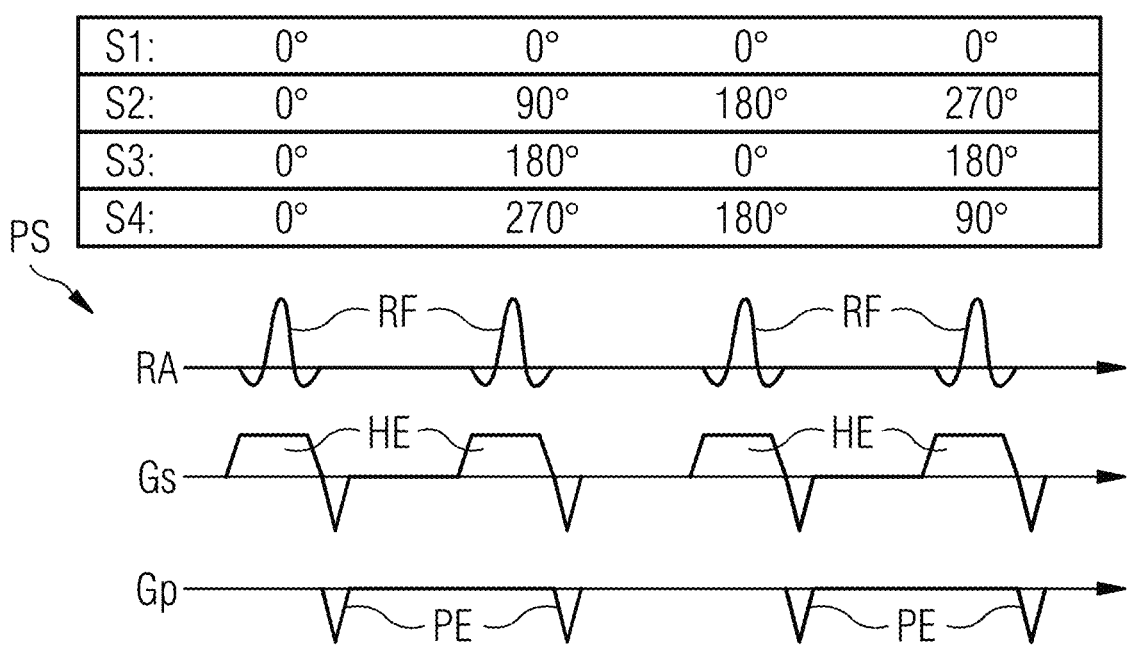
FIG. 7 shows another example of a pulse sequence, in accordance with an embodiment of the present disclosure.

FIG. 7 shows another example of a pulse sequence, in accordance with an embodiment of the present disclosure. This pulse sequence PS is similar to that shown in FIG. 6, with the difference that an extended Hadamard encoding scheme is applied, wherein the phase is changed between 0°, 90°, 180°, and 270° in a complex scheme.

Although the present disclosure has been described in the form of preferred embodiments and variations thereon, it will be understood that numerous additional modifications and variations could be made thereto without departing from the scope of the disclosure. For the sake of clarity, it is to be understood that the use of "a" or "an" throughout this disclosure does not exclude a plurality, and "comprising" does not exclude other steps or elements. The mention of a "unit" or a "module" does not preclude the use of more than one unit or module. The expression "pair" could mean not only two, but also a "set of."

What is claimed is:

1. A method for controlling a magnetic resonance imaging (MRI) system, the method comprising:
applying a multi-band radio-frequency (RF) pulse sequence to simultaneously excite at least two slices of multislice imaging data acquired via the MRI system;
applying, while the multi-band RF pulse sequence is being applied to measure k-space lines, a set of in-plane encoding signals and a set of Hadamard encoding signals in an interleaved scheme,
wherein the interleaved scheme is in the form of an execution loop having (i) an inner loop in which a first set of signals is applied, and (ii) an outer loop in which a second set of signals is applied; and
performing at least one of:
(i) applying a set of extended Hadamard-encoding signals together with an undersampled set of in-plane encoding signals, and
(ii) applying the set of in-plane encoding signals in the outer loop and the set of Hadamard encoding signals in the inner loop.

2. The method according to claim 1, wherein the set of undersampled in-plane encoding signals comprise a set of phase encoding signals, and
wherein the act of applying the set of extended Hadamard-encoding signals together with the undersampled set of in-plane encoding signals includes, when applying the set of undersampled in-plane encoding signals, leaving out complete pairs of k-space lines based on at least one of a regular grid or an irregular pattern.

3. The method according to claim 1, wherein the act of applying the set of extended Hadamard-encoding signals together with the undersampled set of in-plane encoding signals includes using, for the set of extended Hadamard-encoding signals, an integer number N of different phases, wherein the integer number N is a divisor of 360°, and wherein the single phases in the used set of phases are spaced apart in phase space by 360°/N.

4. The method according to claim 3, wherein the integer number N of different phases is 4, such that the phases include 0°, 90°, 180°, and 270°.

5. The method according to claim 1, further comprising:
measuring each k-space line a number of times using two or more phases of the Hadamard encoding with a set of binary Hadamard encoding signals being applied; and
measuring each k-space line with each of the binary Hadamard encoding signals.

6. The method according to claim 1, further comprising:
measuring each k-space line a number of times using two or more phases of the Hadamard encoding;
measuring four slices from among the multislice imaging data with a set of extended Hadamard encoding signals being applied; and
measuring each k-space line with four Hadamard encodings.

7. The method according to claim 1, further comprising:
reconstructing data recorded by the MRI system by:
reconstructing separate signals from the measured slices for each k-space line by creating a linear combination by calculating at least one of (i) a sum and/or a difference over pairs of the recorded k-space lines, or (ii) a weighted sum with complex factors over a number of the recorded k-space lines; and
applying a Hadamard combination line-by-line.

8. The method according to claim 1, further comprising:
reconstructing data recorded by the MRI system by reconstructing an image slice-by-slice for a field of view using at least one of (i) a parallel imaging reconstruction technique using information from all slices to reconstruct a single slice, (ii) a combined reconstruction method, (iii) an iterative imaging reconstruction technique, (iv) a model-based reconstruction technique, and (v) a prior-knowledge-based reconstruction technique.

9. The method according to claim 1, further comprising:
reconstructing data recorded by the MRI system by receiving a measured signal with multiple coils that have parallel-acquisition-technique encoding capability.

10. The method according to claim 1, wherein the same pairs of k-space lines in the Hadamard encoded k-space lines are omitted in each slice from among the multislice imaging data.

11. The method according to claim 1, further comprising:
performing a self-navigation based on Hadamard combined k-space line pairs.

12. A device according for controlling a magnetic resonance imaging (MRI) system, the device comprising:
output circuitry configured to provide a multi-band radio-frequency (RF) pulse sequence that, when applied via the MRI system, simultaneous excites at least two slices of multislice imaging data acquired by the magnetic resonance imaging system; and
sequence-designing circuitry configured to:
apply, while the multi-band RF pulse sequence is being applied to measure k-space lines, a set of in-plane encoding signals and a set of Hadamard encoding signals in an interleaved scheme, the interleaved scheme being in the form of an execution loop having (i) an inner loop in which a first set of signals is applied, and (ii) an outer loop in which a second set of signals is applied, and
perform at least one of:
(i) applying a set of extended Hadamard-encoding signals together with an undersampled set of in-plane encoding signals, and
(ii) applying the set of in-plane encoding signals in the outer loop and the set of Hadamard encoding signals in the inner loop.

13. The device according to claim 12, further comprising:
reconstruction system circuitry configured to reconstruct separate signals from the measured slices for each k-space line by creating a linear combination by calculating at least one of (i) a sum and/or a difference over pairs of the recorded k-space lines, or (ii) applying a Hadamard combination line-by-line, or (iii) reconstruct an image slice-by-slice for a field of view using at least one of a parallel reconstruction technique or a combined reconstruction technique.

14. A non-transitory computer-readable medium having instructions stored thereon that, when executed by one or more processors of a magnetic resonance imaging (MRI) system, cause the MRI system to:
apply a multi-band radio-frequency (RF) pulse sequence to simultaneously excite at least two slices of multislice imaging data acquired via the MRI system;
apply, while the multi-band RF pulse sequence is being applied to measure k-space lines, a set of in-plane encoding signals and a set of Hadamard encoding signals in an interleaved scheme,
wherein the interleaved scheme is in the form of an execution loop having (i) an inner loop in which a first set of signals is applied, and (ii) an outer loop in which a second set of signals is applied; and
perform at least one of:
(i) applying a set of extended Hadamard-encoding signals together with an undersampled set of in-plane encoding signals, and
(ii) applying the set of in-plane encoding signals in the outer loop and the set of Hadamard encoding signals in the inner loop.

* * * * *